United States Patent
Kawaguchi et al.

(10) Patent No.: US 8,816,932 B2
(45) Date of Patent: Aug. 26, 2014

(54) RADIO WAVE TRANSMITTING DECORATIVE MEMBER AND THE PRODUCTION METHOD THEREOF

(75) Inventors: Toshiyuki Kawaguchi, Tokyo (JP); Kazutoki Tahara, Saitama (JP); Tsutomu Saga, Saitama (JP)

(73) Assignee: Shin-Etsu Polymer Co., Ltd. (JP)

( * ) Notice: Subject to any disclaimer, the term of this patent is extended or adjusted under 35 U.S.C. 154(b) by 443 days.

(21) Appl. No.: 13/143,953

(22) PCT Filed: Jan. 19, 2010

(86) PCT No.: PCT/JP2010/000270
§ 371 (c)(1),
(2), (4) Date: Jul. 11, 2011

(87) PCT Pub. No.: WO2010/084733
PCT Pub. Date: Jul. 29, 2010

(65) Prior Publication Data
US 2011/0273356 A1  Nov. 10, 2011

(30) Foreign Application Priority Data

Jan. 20, 2009 (JP) ............................... P2009-010378
Mar. 13, 2009 (JP) ............................... P2009-061136

(51) Int. Cl.
*H01Q 1/36* (2006.01)
(52) U.S. Cl.
USPC ........................................ 343/873; 235/487
(58) Field of Classification Search
USPC ........... 343/873; 235/487, 488, 492; 438/149, 438/283, 45, 200, 158, 527
See application file for complete search history.

(56) References Cited

U.S. PATENT DOCUMENTS

| 4,397,989 A | 8/1983 | Adesko ........................ 525/162 |
| 6,132,817 A | 10/2000 | Tokutake et al. ............. 427/578 |
| 7,223,641 B2 * | 5/2007 | Maekawa ...................... 438/149 |
| 2002/0113922 A1 | 8/2002 | Kusumoto et al. .............. 349/96 |

(Continued)

FOREIGN PATENT DOCUMENTS

| EP | 1548148 A1 | 6/2005 |
| JP | 58-084233 | 6/1983 |

(Continued)

OTHER PUBLICATIONS

Chinese Office Action and English language translation dated Apr. 24, 2013 issued in corresponding Chinese Patent Application No. 201080004798.7.

(Continued)

*Primary Examiner* — Karl D Frech
(74) *Attorney, Agent, or Firm* — Ostrolenk Faber LLP

(57) ABSTRACT

The radio wave transmitting decorative member and the method of producing thereof efficiently and stably of the present invention is provided with radio wave transmitting properties as well as mirror-surface like metallic luster, hardly loses its metallic luster, and can be produced at a low cost. The method of producing a radio wave transmitting decorative member, having a substrate, a transparent organic material layer, and a light reflecting layer formed of an alloy composed of either silicon or germanium and a metal provided between the substrate and the transparent organic material layer; wherein the light reflecting layer is formed from a target having an alloy composed of either silicon or germanium, and of a metal with the use of a DC magnetrons sputtering.

14 Claims, 7 Drawing Sheets

(56) References Cited

U.S. PATENT DOCUMENTS

| | | |
|---|---|---|
| 2009/0058283 A1 | 3/2009 | Tanaka et al. ............... 313/504 |
| 2009/0258234 A1 | 10/2009 | Chiang et al. ............... 428/412 |
| 2010/0207842 A1 | 8/2010 | Kawaguchi et al. .......... 343/907 |

FOREIGN PATENT DOCUMENTS

| | | |
|---|---|---|
| JP | 8-31569 | 2/1996 |
| JP | A-2002-065873 | 3/2002 |
| JP | 2002-135030 | 5/2002 |
| JP | A-2002-173340 | 6/2002 |
| JP | 3414717 | 6/2003 |
| JP | 2004-018946 | 1/2004 |
| JP | 2004-103695 | 4/2004 |
| JP | B-3602861 | 12/2004 |
| JP | 2005-249773 | 9/2005 |
| JP | 2006-276008 | 10/2006 |
| JP | 2006-282886 | 10/2006 |
| JP | 2007-285093 | 11/2007 |
| JP | 2008-038249 | 2/2008 |
| JP | 2008-200861 | 9/2008 |
| JP | 2008-207337 | 9/2008 |
| WO | WO 2008/020482 A1 | 2/2008 |

OTHER PUBLICATIONS

Supplementary European Search Report dated Apr. 12, 2013 issued in corresponding European Patent Application No. 10733341.1.
International Search Report and Written Opinion mailed Apr. 6, 2010 in corresponding PCT International Application No. PCT/JP2010/000270.
International Search Report and Written Opinion mailed Jun. 15, 2010 issued in corresponding PCT International Application No. PCT/JP2010/001826 (with English translation).
Search Report dated Jan. 30, 2013 issued in corresponding European Patent Application No. 10753275.6.
Search Report dated Apr. 12, 2013 issued in corresponding European Patent Application No. 10733341.1.
Office Action dated Aug. 13, 2013 issued in corresponding U.S. Appl. No. 13/256,643 (first page only).
Office Action dated Aug. 13, 2013 issued in corresponding U.S. Appl. No. 13/256,643 (21 pages).
Final Office Action dated Feb. 26, 2014 issued in corresponding U.S. Appl. No. 13/256,643.
DuPont, Hytrel thermoplastic polyester elastomer—the first 2 cover pages, pp. 1, 3, 5 and 6 and the last page of the document (2000) http://www2.dupont.com/Plastics/en_US/assets/downloads/processing/H81091.pd.

* cited by examiner

RADIO WAVE TRANSMITTING DECORATIVE MEMBER AND THE PRODUCTION METHOD THEREOF

CROSS-REFERENCE TO RELATED APPLICATIONS

The present application is a 35 U.S.C. §§371 national phase conversion of PCT/JP2010/000270, filed Jan. 19, 2010, which claims priority of Japanese Patent Application Nos. 2009-010378 and 2009-061136, filed Jan. 20, 2009 and Mar. 13, 2009, respectively, the contents of which are incorporated herein by reference. The PCT International Application was published in the Japanese language.

TECHNICAL FIELD

The present invention relates to a radio wave transmitting decorative member having metallic luster and the production method thereof.

BACKGROUND OF THE ART

From the viewpoint of design properties, metallic decorative members, in particular, decorative members having mirror-surface like metallic luster have been widely used in the casing or buttons of mobile phones; the casing of watches; and the front grille, bumper or the like of a vehicle.

As such decorative members, a decorative member that transmits radio waves (microwaves or the like) without adversely affecting the radio waves has been required for the following reasons.

(i) An antenna for transmitting and receiving radio waves is disposed inside the casing of a mobile phone.

(ii) An antenna for receiving radio waves is disposed inside the casing of a radio controlled clock that is provided with a function to receive the standard wave and to automatically correct errors.

(iii) In a vehicle equipped with a radar device that detects the presence of obstacles or measures the distance between vehicles, an antenna in the radar device is disposed in the vicinity of a front grille or a bumper.

(iv) The frequency of radio waves used in the communication devices (Wireless PAN such as Bluetooth, UWB, ZigBee or the like) has been shifting to a high frequency range, at which radio waves are readily affected by the decorative members, and thus these devices are prone to functional disorders.

The following materials have been proposed as the decorative members that allow the passing through of radio waves and are provided with metallic luster.

(1) A shaped article having a deposited film of indium, an indium alloy, tin, or a tin alloy, on a substrate (refer to Patent Document 1).

(2) A transfer material having a deposited film of an indium/indium oxide complex on a base material (refer to Patent Document 2).

(3) A decorative product having a coating film, in which fine pieces of luminescent materials are dispersed, on a base material (refer to Patent Document 3).

(4) A decorative product having a reflective film (metal) which is provided with an opening on a base material (refer to Patent Document 4).

With respect to the metal deposited film of indium, tin, lead, zinc, bismuth, antimony, or the like, it has been known that because the metal is present as a minute independent island, radio waves can pass through the gaps between the islands where no metal is present. For this reason, the decorative members described above in (1) and (2) have radio wave transmitting properties as well as metallic luster.

However, with respect to the decorative members of (1) and (2), if the thickness of the metal deposited film is increased in order to attain a satisfactory level of metallic luster, the islands become partially connected with each other and form a network that serves as a good conductor, and thus the reflection or absorption of radio waves occurs depending on the frequency thereof. Therefore, it is necessary to check all decorative members in order to make sure that the product using the decorative members (1) and (2) are not disturbing straight radio wave transmission, and do not cause other disturbances. Accordingly, the productivity of the decorative members (1) and (2) are low.

In addition, tin is prone to oxidation, chlorination, or the like, as a result of which the metallic luster thereof is lost over time. On the other hand, indium is highly expensive.

Because the above decorative member of (3) is a product in which luminescent materials are dispersed in a coating film, it is not provided with mirror-surface like metallic luster.

On the other hand, with respect to the above decorative member of (4), only radio waves having a specific frequency that conforms to the size of the opening of the light reflecting layer can pass therethrough, therefore, the use of the decorative member of (4) is limited due to the specific frequency.

DISCLOSURE OF THE INVENTION

Problems to be Solved by the Invention

[Patent Document 1] Japanese Laid-Open Patent Application No. 2005-249773
[Patent Document 2] Japanese Patent No. 3414717
[Patent Document 3] Japanese Laid-Open Patent Application No. 2006-282886
[Patent Document 4] Japanese Laid-Open Patent Application No. 2006-276008

Means for Solving the Problems

The method of producing the radio wave transmitting decorative member of the present invention provides efficient and stable production of the radio wave transmitting decorative member having radio wave transmitting properties as well as mirror-surface like metallic luster, hardly loses its metallic luster, and can be produced at a low cost.

The radio wave transmitting decorative member of the present invention is characterized by having a substrate, a transparent organic material layer, and a light reflecting layer formed of an alloy composed of either silicon or germanium and a metal provided between the substrate and the transparent organic material layer.

The light reflecting layer is preferably a deposition film formed by a physical vapor deposition of an alloy composed of either silicon or germanium and a metal.

The transparent organic material layer is preferably a shaped article formed of a transparent organic material.

The substrate is preferably a shaped article formed of an organic material.

The radio wave transmitting decorative member of the present invention may include a low refractive index layer having a lower refractive index than that of the transparent organic material later, provided between the transparent organic material layer and the light reflecting layer.

The low refractive index layer may be a space formed of an air or a vacuum.

The radio wave transmitting decorative member of the present invention may include a colored layer between the transparent organic material layer and the light reflecting layer.

The colored layer may be a patterned layer formed of alphabets, symbols, figures, patterns, and the like.

The radio wave transmitting decorative member of the present invention may also include an adhesion promoting layer provided abut the light reflecting layer.

The adhesion promoting layer preferably contains a metallic oxide.

The adhesion promoting layer is preferably formed by dealcoholizing condensation of a resin having a metal alkoxyl group.

A method of producing a radio wave transmitting decorative member of the present invention provides a method of producing a radio wave transmitting decorative member having a substrate, a transparent organic material layer, and a light reflecting layer formed of an alloy composed of either silicon or germanium and a metal provided between the substrate and the transparent organic material layer. The light reflecting layer is formed from a target having an alloy composed of either silicon or germanium, and of a metal by using a DC magnetrons spattering.

The target further preferably contains a dopant.

The target is preferably a shaped article of an alloy powder having average particle diameter of less than 100 μm.

Effect of the Invention

The radio wave transmitting decorative member of the present invention is provided with radio wave transmitting properties as well as mirror-surface like metallic luster, hardly loses its metallic luster, and can be produced at a low cost.

The method of producing the radio wave transmitting decorative member of the present invention provides efficient and stable production of the radio wave transmitting decorative member having radio wave transmitting properties as well as mirror-surface like metallic luster, hardly loses its metallic luster, and can be produced at a low cost.

BEST MODE FOR CARRYING OUT THE INVENTION

The term "light" used in the present invention refers to visible light.

The term "radio wave" refers to electromagnetic waves having a frequency ranging from 10 MHz to 1,000 GHz (i.e., from submillimeter waves to microwaves).

The term "transparent" used in the present invention refers to light transmitting properties.

The First Embodiment

Figure 1:
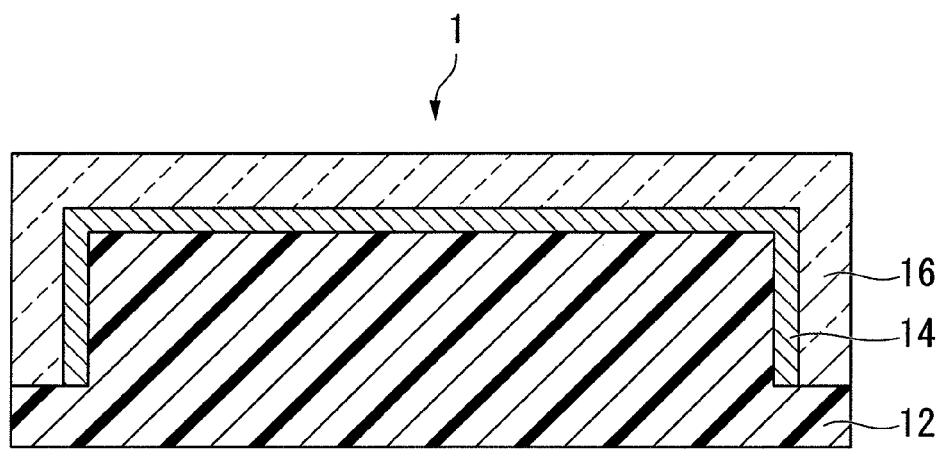
FIG. 1 is a cross sectional view showing an example of a radio wave transmitting decorative member according to the present invention.

FIG. 1 is a cross sectional view showing an example of a radio wave transmitting decorative member of the present invention.

A radio wave transmitting decorative member 1 includes a substrate 12 having a convex side; a transparent organic material layer 16 having a concave side and a light reflecting layer 14, wherein the light reflecting layer 14 is placed in the concave side of the transparent organic material layer 16; wherein the radio wave transmitting decorative member 1 is integrated by incorporating the convex side and the concave side.

(Substrate)

A substrate 12 is a shaped article of a radio wave transmitting material.

Examples of radio wave transmitting materials include insulating substrates made of an insulating organic or inorganic material. The term "insulating" means a surface resistivity of $10^6 \Omega$ or higher, and the surface resistivity is preferably $10^8 \Omega$ or higher. The surface resistivity of a substrate is measured by a four-pin probe method in conformity with JIS K7194. An insulating organic material is preferable as a radio wave transmitting material from the viewpoint of processability.

Examples of the organic materials include polyolefin (polyethylene, polypropylene, ethylene-propylene copolymer, ethylene-vinyl acetate copolymer, or the like), cyclic polyolefin, modified polyolefin, polyvinyl chloride, polyvinylidene chloride, polystyrene, polyamide (nylon 6, nylon 46, nylon 66, nylon 610, nylon 612, nylon 11, nylon 12, nylon 6-12, nylon 6-66, or the like), polyimide, polyamideimide, polycarbonate, poly-(4-methylpentene-1), an ionomer, an acrylic resin (polymethyl methacrylate, or the like) an acrylonitrile-butadiene-styrene copolymer (an ABS resin), an acrylonitrile-styrene copolymer (an AS resin), a butadiene-styrene copolymer, polyoxymethylene, polyvinyl alcohol, an ethylene-vinyl alcohol copolymer, polyester (polyethylene terephthalate, polybutylene terephthalate, polycyclohexane terephthalate, or the like), polyether, polyether ketone, polyether ether ketone, polyether imide, polyacetal, polyphenylene oxide, modified polyphenylene oxide, polysulfone, polyether sulfone, polyphenylene sulfide, polyallylate, aromatic polyester (liquid crystal polymer), polytetrafluoroethylene, polyvinylidene fluoride, other fluorine-based resins, and thermoplastic elastomers (a styrene-based elastomer, a polyolefin-based elastomer, a polyvinyl chloride-based elastomer, a polyurethane-based elastomer, a polyester-based elastomer, a polyamide-based elastomer, a polybutadiene-based elastomer, a trans-polyisoprene-based elastomer, a fluororubber-based elastomer, a chlorinated polyethylene-based elastomer, or the like), an epoxy resin, a phenolic resin, a urea resin, a melamine resin, unsaturated polyester, a silicone-based resin, a urethane-based resin, a polyparaxylylene resin, natural rubber, polybutadiene rubber, polyisoprene rubber, acrylonitrile-butadiene copolymer rubber, styrene-butadiene copolymer rubber, styrene-isoprene copolymer rubber, styrene-butadiene-isoprene copolymer rubber, a hydrogenated product of diene-based rubber, saturated polyolefin rubber (ethylene-α-olefin copolymers such as an ethylene-propylene copolymer), an ethylene-propylene-diene copolymer, an α-olefin-diene copolymer, urethane rubber, silicone rubber, polyether-based rubber, and acrylic rubber.

One type of these organic materials may be used alone or two or more types thereof may be combined and used as a copolymer, a blended product, a polymer alloy, a laminated body, or the like.

These organic materials may contain an additive if necessary. Examples of the additives include a reinforcement, an antioxidant, an ultraviolet absorber, a lubricant, an antifogging agent, a fog preventing agent, a plasticizer, a pigment, a near infrared absorber, an antistatic agent, and a colorant.

Examples of the inorganic materials include glass (silicate glass, quartz glass, or the like), metal oxides ($Al_2O_3$, BeO, MgO, $ZrO_2$, $Cr_2O_3$, or the like), metal nitrides (AlN, $Si_3N_4$, TiN, or the like), metal carbides (TiC or the like), metal nitrides ($MoB_2$, $Ti_2B$, or the like), and ceramics such as metal silicides ($MoSi_2$, $W_3Si_2$, or the like).

One type of these inorganic materials may be used alone or two or more types thereof may be combined.

(Transparent Organic Material Layer)

A transparent organic material layer 16 is composed of a shaped article formed of a transparent organic material having a radio wave transmitting property, and protects a light reflecting layer 14.

An example of a transparent organic material of a radio wave transmitting property includes an insulating transparent organic material.

Examples of the transparent organic materials include polyolefin (polyethylene, polypropylene, ethylene-propylene copolymer, ethylene-vinyl acetate copolymer, or the like), cyclic polyolefin, modified polyolefin, polyvinyl chloride, polyvinylidene chloride, polystyrene, polycarbonate, poly-(4-methylpentene-1), an ionomer, an acrylic resin, polymethyl methacrylate, an acrylonitrile-butadiene-styrene copolymer (an ABS resin), an acrylonitrile-styrene copolymer (an AS resin), a butadiene-styrene copolymer, polyester (polyethylene terephthalate, polybutylene terephthalate, polycyclohexane terephthalate, or the like), polyphenylene oxide, modified polyphenylene oxide, polysulfone, polyether sulfone, polyvinylidene fluoride, unsaturated polyester, a silicone-based resin, a urethane-based resin, and a polyparaxylylene resin. From the viewpoints of transparency, strength and transparency in humidity, polycarbonate (Refraction index: 1.59), polymethyl methacrylate (Refraction index: 1.49), AS resin (Refraction index: 1.57), polystyrene (Refraction index: 1.60), cyclic polyolefin or the like (Refraction index: 1.51-1.54), and polyethylene terephthalate (Refraction index: 1.51) are preferably used. The refraction index is based on a D line of sodium (wavelength: 589.3 nm) at 23° C.

One type of these organic materials may be used alone or two or more types thereof may be combined and used as a copolymer, a blended product, a polymer alloy, a laminated body, or the like.

These organic materials may contain an additive if necessary. Examples of the additives include a reinforcement, an antioxidant, an ultraviolet absorber, a lubricant, an antifogging agent, a fog preventing agent, a plasticizer, a pigment, a near infrared absorber, an antistatic agent, and a colorant.

(Light Reflecting Layer)

The light reflecting layer 14 is a layer formed of an alloy composed of either silicon or germanium and a metal.

When using an alloy composed of either silicon or germanium, the reflectance and lightness of the light reflecting layer 14 improve, as compared to the case where either silicon or germanium is used alone, and thus a bright light reflecting layer 14 can be obtained. In addition, because the alloy is soft compared to silicon, internal stress of the light reflecting layer 14 is reduced, thereby improving the adhesiveness thereof with the substrate 12 and suppressing the occurrence of cracks.

Silicon and germanium are semiconductor materials, unlike the metals described later.

Silicon and germanium may contain impurities which do not act as dopants, as long as the surface resistivity of the light reflecting layer 14 can be maintained at a high level.

It is preferable that silicon (melting point: 1414° C.) and germanium (melting point: 959° C.) contain as little dopants such as boron (melting point: 2300° C.), phosphorus (melting point: 590° C.), arsenic (melting point: 817° C.) and antimony (melting point: 631° C.) as possible. The amount of dopants is preferably 10 ppm or less, and more preferably 100 ppb or less.

Among semiconductor materials, silicon is particularly preferable from the following view points.

(i) The reflectance of the silicon is high.

(ii) Since silicon has less conductivity, it enables to contain high amount of the metal within the alloy. The silicon is capable of maintaining radio wave transmitting properties, lightness of the light reflecting layer improves, and internal stress of the light reflecting layer is also reduced.

(iii) It is easy to obtain and the like.

As a metal, a metal exhibiting a reflectance of 50% or higher is preferable. Examples of the metals include gold (melting point: 1064° C.), silver (melting point: 962° C.), copper (melting point: 1085° C.), aluminum (melting point: 660° C.), platinum (melting point: 1772° C.), iron (melting point: 1535° C.), nickel (melting point: 1455° C.), and chromium (melting point: 1890° C.). Aluminum and silver are preferably used, and aluminum is more preferably used from the viewpoints of reflectance and cost.

The term "reflectance" refers to the diffuse reflectance including the regular reflectance which is measured in accordance with JIS Z 8722 under a condition of d (n-D). The reflectance is measured including the regular reflection of luster component using an integrating sphere and is calculated as an average of measured values across the visible light region, which is ranging from the short wavelength side 360 nm to 400 nm to the long wavelength side, 760 nm to 830 nm.

The amount of the metal within the alloy (which is 100% in terms of volume) is preferably within a range from 0.1 to 70 volume %, and more preferably within a range from 40 to 70 volume %. When the amount of the metal is 0.1 volume % or more, lightness of the light reflecting layer 14 is improved and internal stress of the light reflecting layer 14 is also reduced. When the amount of the metal is 70 volume % or less, radio wave transmitting properties are improved even further.

The alloy may contain impurities other than silicon, germanium and metals, as long as the surface resistivity and metallic luster of the light reflecting layer 14 can be maintained at a high level.

The thickness of the light reflecting layer 14 is preferably within a range from 10 to 500 nm, and more preferably within a range from 50 to 200 nm. When the thickness of the light reflecting layer is 10 nm or more, it becomes difficult for light to pass therethrough, and thus a satisfactory level of metallic luster can be attained. On the other hand, when the thickness of the light reflecting layer is 500 nm or less, increases in the electrical conductivity due to the presence of impurities is suppressed, and thus a satisfactory level of radio wave transmitting properties can be maintained. Moreover, increase in the internal stress can be suppressed, thereby suppressing the warp and deformation of decorative members, the occurrence of cracks, delamination or the like.

The thickness of the light reflecting layer 14 is not thick enough, it allows light to pass therethrough, and the reflectance decreases, thus a dark metallic luster can be attained. Therefore, brightness of the metallic luster can be adjusted by changing the thickness of the light reflecting layer 14.

The thickness of the light reflecting layer 14 can be measured from a cross section of the light reflecting layer with use of a high-resolution microscopy.

The surface resistivity of the light reflecting layer 14 is preferably $10^3 \Omega$ or higher, and more preferably $10^6$ or higher. When the surface resistivity of the light reflecting layer 14 is $10^3 \Omega$ or higher, a satisfactory level of radio wave transmitting properties can be maintained.

The surface resistivity of the light reflecting layer 14 is measured by a four-pin probe method in conformity with JIS K7194.

The average surface roughness of the light reflecting layer 14 is preferably 0.05 μm or less. When the average surface roughness of the light reflecting layer 14 is 0.05 μm or less, irregular reflection is suppressed, and thus a satisfactory level of metallic luster can be attained. The lower limit for the average surface roughness of the light reflecting layer 14 is set to 0.1 nm, which can be achieved with a polishing process.

The average surface roughness of the light reflecting layer 14 used herein refers to an arithmetic average roughness Ra determined in accordance with JIS B 0601-2001. More specifically, a surface profile of the light reflecting layer is measured by an atomic force microscope, and a reference length is extracted in the average line direction, followed by the determination of average value (i.e., arithmetic average roughness Ra) derived from the sum of absolute values of deviations ranging from the average line in which the reference length is extracted to the roughness curve.

The average surface roughness of the light reflecting layer 14 is affected by an average surface roughness of a base (substrate 12, transparent organic material layer 16, a low refractive index layer, an adhesion promoting layer, a colored layer and the like). Therefore, the average surface roughness of the base is preferably 0.5 μm or less, and more preferably 0.1 μm or less. If the average surface roughness of the base is 0.5 μm or less, the light reflecting layer 14 follows the surface of the base even if the light reflecting layer 14 is thinned, a satisfactory level such as mirrors of metallic luster can be attained.

The average surface roughness of the base used herein refers to an arithmetic average roughness Ra determined in accordance with JIS B 0601-2001.

The light reflecting layer 14 is formed, for example, by a physical vapor deposition of an alloy composed of either silicon or germanium and a metal.

The physical vapor deposition process is a method for forming a thin film by vaporizing an evaporation material (an alloy) in a vacuum vessel in some way and then depositing the vaporized evaporation material on top of the base placed nearby, and the process can be further classified into an evaporation deposition process and a sputtering deposition process, depending on the method for vaporizing an evaporation material. Examples of the evaporation deposition process include an electron beam (EB) deposition process, an ion plating process, a pulse laser deposition process, and the like. Examples of the sputtering deposition process include a radiofrequency (RF) sputtering process, a magnetron sputtering process, and an opposite target type magnetron sputtering process, ECR sputtering process and the like.

Although an EB deposition process tends to form a porous film having an unsatisfactory level of film strength, damages inflicted on the base are minimal. In addition, an ion plating process is preferred because a film having an intense adhesive force can be obtained. An RF sputtering process is preferred because a target (evaporation material) with high resistance can be used. Particularly, a DC magnetron sputtering process is preferred because a film can be grown at a high growth rate, an opposite target type DC magnetron sputtering process is preferred because a thin film can be formed without giving plasma damages to the base.

A target used for a DC magnetron sputtering process is preferably an alloy which is mixed with silicon and aluminum evenly in atomic level. However, it is necessary to cool the melt-mixed alloy rapidly because the desired alloy composition is not an eutectic composition, the melting point of each element is different, and diffusion at an atomic level is unlikely to happen. When segregation of silicon or germanium occurs, the alloy would have a poor conductivity. Therefore, an uneven electrical current flow running in the target will be caused during DC magnetron sputtering process, and a metal which is a good conductor having a low melting point is easily deposited, resulting in an unstable composition ratios of the elements.

Accordingly, it is preferable to dope silicon or germanium to allow an electric current flow as much as possible. In addition, it is preferable to use an alloy powder of small diameter having a small heat capacity in order to cool the melting alloy rapidly. Average particle diameter of the alloy powder is preferably 100 μm or less, more preferably 50 μm or less, and most preferably 10 μm or less.

Examples of a method of producing the alloy powder include Atomized method which dry sprays a melt metal; Mechanical alloying method which produces an alloy powder at a low temperature with use of a ball-mill device. The obtained alloy powder is capable of being formed a target by pressing and heating the alloy powder based on a powder metallurgy technique. It is important to minimize heating of the alloy powder to avoid segregation of the alloy powder. The porosity of the target is preferably 20% or less.

Figure 2:
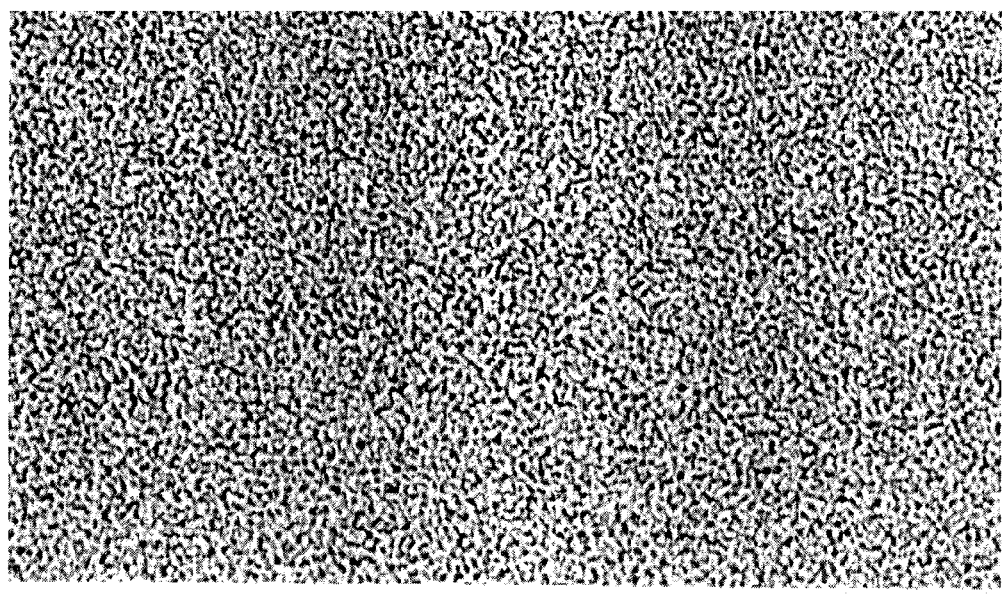
FIG. 2 is a high-resolution transmission electron microscope image of the surface of a light reflecting layer.

FIG. 2 is a high-resolution transmission electron microscope image of the cross section of a light reflecting layer formed by DC magnetron sputtering process using a silicon-aluminum alloy. It can be seen that unlike the assembly of independent islands (microclusters) observed in conventional cases where indium, tin, or the like is used, no space is present where the alloy is absent, as a result of which a continuous layer having a homogeneous amorphous structure is formed.

The Second Embodiment

Figure 3:
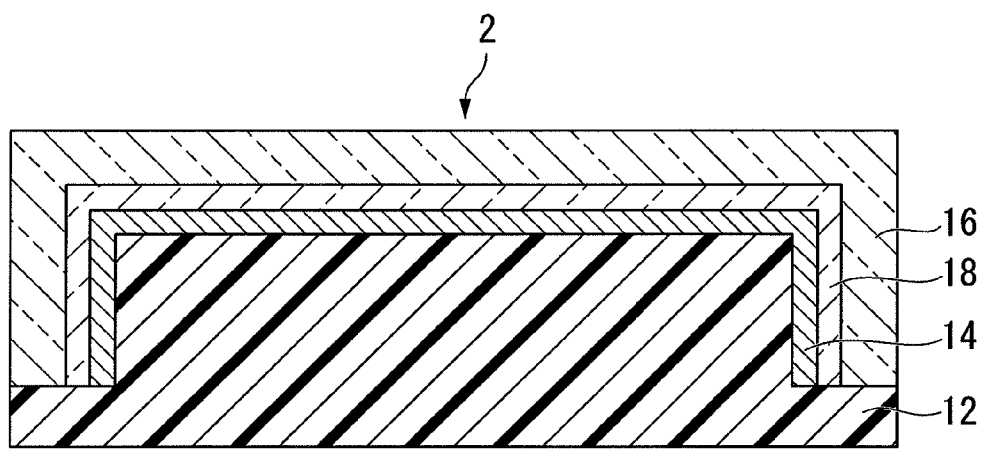
FIG. 3 is a cross sectional view showing another example of a radio wave transmitting decorative member according to the present invention.

FIG. 3 is a cross sectional view showing another example of a radio wave transmitting decorative member according to the present invention.

A radio wave transmitting decorative member 2 includes a substrate 12 having a convex side; a transparent organic material layer 16 having a concave side which corresponds to the convex side, a low refractive index layer 18 placed in the concave side, and further a light reflecting layer 14 placed on the surface of the low refractive index layer 18; wherein the radio wave transmitting decorative member 2 is integrated by incorporating the convex side and the concave side.

Since the reference number in Embodiment 2 is the same as the one represented in Embodiment 1, explanations of the reference numbers which have already been described will be omitted.

(A Low Refractive Index Layer)

A low refractive index layer 18 is lower in refractive index than that of the transparent organic material layer 16.

The low refractive index layer 18 placed between the transparent organic material layer 16 and the light reflecting layer 14 is capable of obtaining a much lighter metallic luster for the following reasons.

Among the irregular reflection component of the light reflected by the light reflecting layer 14, the incident light with large angle to a boarder of the transparent organic material layer 16 and the outer air is all reflected by the transparent organic material layer 16 and does not appear from the transparent organic material layer 16. Accordingly, placing the low refractive index layer 18 between the transparent organic material layer 16 and the light reflecting layer 14 is capable of emitting most of the light reflected by the light reflecting later 14 to outside by reducing the incident angle. Therefore, the radio wave transmitting decorative member 2 with the low refractive index layer 18 has a large reflectivity, and obtaining a much lighter metallic luster.

An example of the low refractive index layer 18 includes a transparent material having a radio wave transmission property. Examples of transparent materials having a radio wave transmission property include an insulating transparent organic material or a transparent inorganic material.

Among the materials which can be used for transparent organic material layer 16, a material having a low refractive index is selected as a transparent organic material.

Examples of transparent organic materials include a low refractive index glass, silica (refractive index: 1.46), or the like.

The low refractive index layer 18 may be a space formed of a gas (air or the like) or a vacuum.

The thickness of the low refractive index layer 18 is preferably larger than the thickness of the wavelength of visual light, and more preferably 1 μm to 1 mm.

The Third Embodiment

Figure 4:
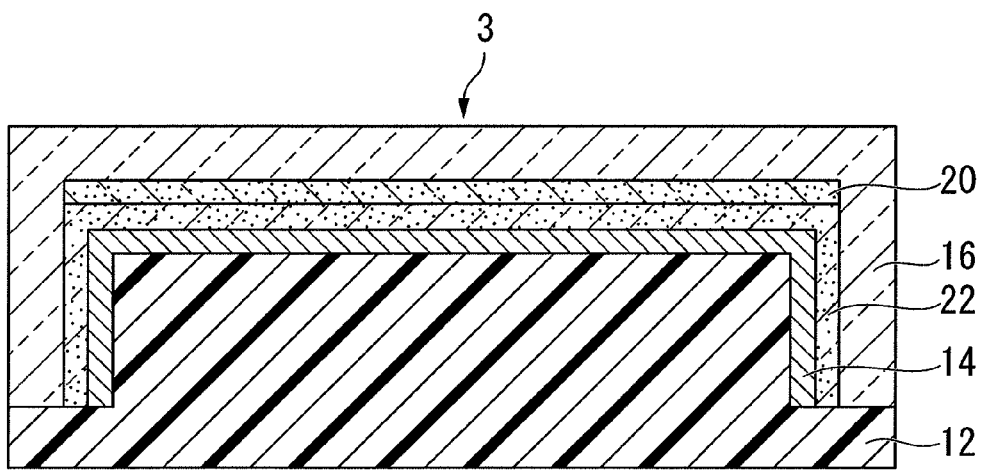
FIG. 4 is a cross sectional view showing another example of a radio wave transmitting decorative member according to the present invention.

FIG. 4 is a cross sectional view showing another example of a radio wave transmitting decorative member of the present invention.

A radio wave transmitting decorative member 3 includes a substrate 12 having a convex side; a transparent organic material layer 16 having a concave side corresponding to the convex side, a transparent colored layer 20 placed on the bottom of the concave side, further an adhesion promoting layer 22 placed on the surface of the transparent colored layer 20, and further a light reflecting layer 14 placed on the surface of the adhesion promoting layer 22; wherein the radio wave transmitting decorative member 3 is integrated by incorporating the convex side and the concave side.

Since the reference number in Embodiment 3 is the same as the one represented in Embodiment 1, explanations of the reference numbers which have already been described will be omitted.

(Colored Layer)

A transparent colored layer 20 is placed between a transparent organic material layer 16 and a light reflecting layer 14. The layer 20 is capable of adjusting a brightness of a metallic luster or colorfulness, and also provides a desirable design property. Generally, the transparent colored layer 20 is capable of providing a desirable color by adjusting the brightness of the metallic luster to dark direction.

An example of the transparent colored layer 20 includes a transparent colored organic material having a radio wave transmitting property. An example of transparent colored material having a radio wave transmission property includes an insulating transparent organic material. As a transparent colored organic material, a low refractive index layer 18 mixed with a dye or a pigment is preferably used.

(Adhesion Promoting Layer)

An adhesion promoting layer 22 improves an adhesion between the light reflecting layer 14 and the base (substrate 12, transparent organic material layer 16, low refractive index layer 18, colored layer and the like). The adhesion promoting layer 22 is preliminary formed on a surface of the base before forming the light reflecting layer 14.

A material of an adhesion promoting layer 22 having a radio wave transmitting property and a light transmitting property; having an adhesion property for a base; and being capable of covalent bonding, coordinate bonding, or hydrogen bonding with a light reflecting layer is preferably used. Examples of the above materials include (a) an adhesion promoting agent, (b) a metallic oxide, (c) a composite of an adhesion promoting agent and a metallic oxide.

(a) Examples of adhesion promoting agents includes a resin which has a bond having a polar character (ester bond, urethane bond, allophanate bond, urea bond, biuret bond, amide bond or the like) or a group having a polar character (hydroxyl group, carboxyl group, amino group, isocyanate group, oxazoline group, mercapto group, epoxy group or the like) at a main chain or at a side chain.

Examples of polar resin include a cellulose nitrate, an acrylate resin, an urethane resin, a polyphosphazene, a polyamide, an epoxy resin or the like.

The adhesion promoting agent may further include a silane coupling agent. Examples of silane coupling agents include vinyltriethoxysilane, vinyl tris (2-methoxyethoxy)silane, 3-methacryloxypropyltrimethoxysilane, 3-glycidoxypropyltrimethoxysilane, 2-(3,4-epoxycyclohexylethyl)ethyltrimethoxysilane, N-2-(aminoethyl)-3-aminopropyltrimethoxysilane, N-2-(aminoethyl)-3-aminopropylmethyldimethoxysilane, 3-aminopropyltriethoxysilane, N-phenyl-3-aminopropyltrimethoxysilane, 3-mercaptopropyltrimethoxysilane, 3-chloropropyltrimethoxysilane, cyanoethyltrimethoxysilane, cyanopropyltriethoxysilane or the like.

(b) As a metallic oxide, oxidized silicon and oxidized titanium are preferably used. A metallic oxide is preferably particles, and an average particle size thereof is preferably 5 to 1000 nm.

(c) An example of a composite of an adhesion promoting agent and a metallic oxide includes (c1) a composite composed by mixing a metallic oxide to an adhesion promoting agent, (c2) a composite composed by mixing a metallic alkoxide to an adhesion promoting agent, followed by coagulating and segregating a metallic oxide by dealcoholizing condensation in the adhesion promoting agent, (c3) a composite produced by coagulating and segregating a polar resin having a metallic alkoxide at side chain (epoxy resin, acryl resin, polyimide, or the like) by dealcoholizing condensation in the polar resin, (c3) is preferably used since the metallic oxide and the polar resin as the adhesion promoting agent are covalently bonded.

A dealcoholizing condensation of a resin is preferably carried out after forming a light reflecting layer 14 since the resin enables to covalently bond with the light reflecting layer 14. In addition, hydrophilic treatment of a base surface is preliminary carried out (by chemical conversion treatment with use of chemicals, corona discharge treatment, UV irradiation, oxygen plasma treatment, Itro treatment or the like), followed by coagulating and segregating a metallic oxide by dealcoholizing condensation is capable of placing the metallic oxide over the entire surface of the base and enables improvement of the adhesion ability and the reflectivity thereof.

An amount of a metallic oxide in a composite is preferably 15 to 70% by volume in solid conversion.

When an adhesion promoting layer 22 contains a metallic oxide, the following effect may appear.

When a light reflecting layer 14 is formed on a base surface by physical vapor deposition, ions of the element (silicon, aluminum or the like) constituted in the light reflecting layer 14 invade and immerse inside the base from the boarder of the base surface and the light reflecting layer 14, and the boarder of the base and the light reflecting layer 14 becomes unclear, and the surface of the boarder becomes extremely large. As a result, the reflectance of the incident light from the base surface to the light reflecting layer 14 is decreased compared to the reflectance of the incident light to the surface of the light reflecting layer 14 which is opposite of the base. Therefore, by placing a metallic oxide which is a transparent and hard between the boarder of the base and the light reflecting layer 14 is capable of suppressing the invasion or immersion of the ions in the base.

The Fourth Embodiment

Figure 5:
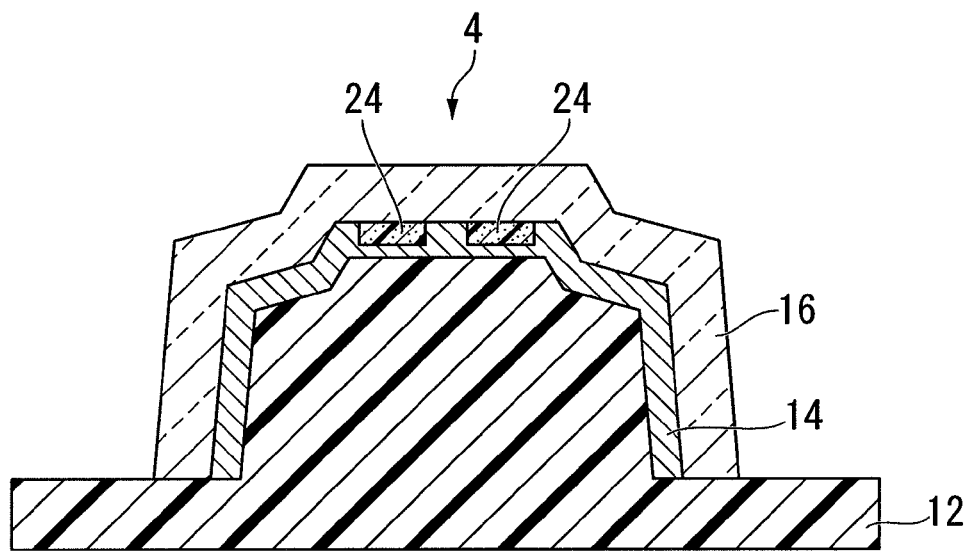
FIG. 5 is a cross sectional view showing another example of a radio wave transmitting decorative member according to the present invention.

FIG. 5 is a cross sectional view showing another example of a radio wave transmitting decorative member according to the present invention.

A radio wave transmitting decorative member 4 includes a substrate 12 having a convex side; a transparent organic material layer 16 having a concave side which corresponds to the convex side, a colored pattern layer 24 placed on the bottom of the concave side, and further a light reflecting layer 14 placed on the surface of the colored pattern layer 24 and the sides of the concave side; wherein the radio wave transmitting decorative member 4 is integrated by incorporating the convex side and the concave side.

Since the reference number in Embodiment 4 is the same as the one represented in Embodiment 1, explanations of the reference numbers which have already been described will be omitted.

(Colored Layer)

A colored pattern layer 24 is formed by placing a material having cover-up property (light impermeant or light low permeant) in desirable pattern such as alphabets, symbols, figures, patterns, and the like. Looking down the radio wave transmitting decorative member 4 from the above, characters (kana, alphabet, numbers or the like) or symbols or the like appear in the colored pattern layer 24 against a background, such as the metallic luster.

The colored pattern layer 24 is capable of being formed by a known print ink, or print using paint.

The Fifth Embodiment

Figure 6:
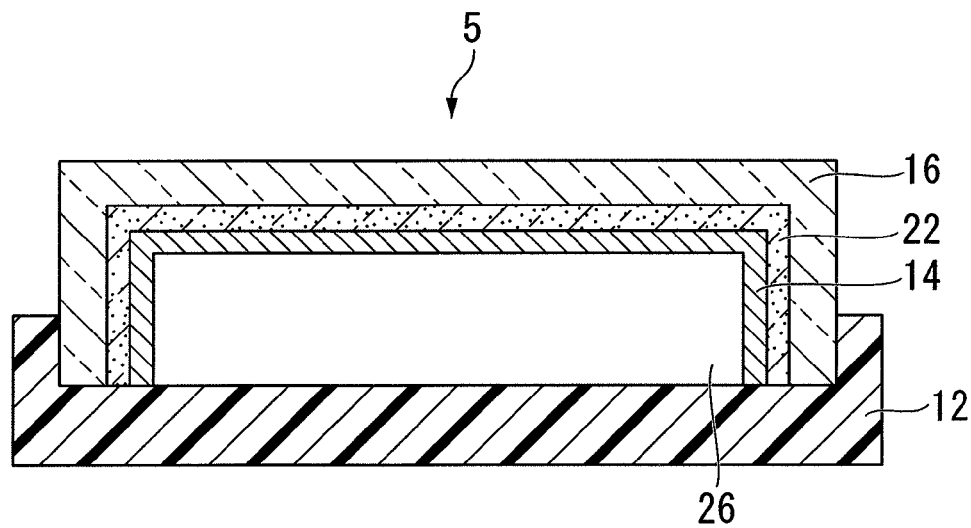
FIG. 6 is a cross sectional view showing another example of a radio wave transmitting decorative member according to the present invention.

FIG. 6 is a cross sectional view showing another example of a radio wave transmitting decorative member of the present invention.

A radio wave transmitting decorative member 5 includes a substrate 12 having a concave side; a transparent organic material layer 16 having a concave side, wherein the outer circumference of the transparent organic material layer 16 is the same as the inner circumference of the concave side of the substrate 12. The radio wave transmitting decorative member 5 is integrated by facing the concave side of the transparent organic material layer 16 with the concave side of the substrate 12, forming a space 26 between these concave sides. An adhesion promoting layer 22 is placed inner face of the transparent organic material layer 16, and further a light reflecting layer 14 is placed on the surface of the adhesion promoting layer 22.

It is capable of making the radio wave transmitting decorative member 5 lighter by placing the space 26.

Since the reference number in Embodiment 5 is the same as the one represented in Embodiment 1 and 3, explanations of the reference numbers which have already been described will be omitted.

The Sixth Embodiment

Figure 7:
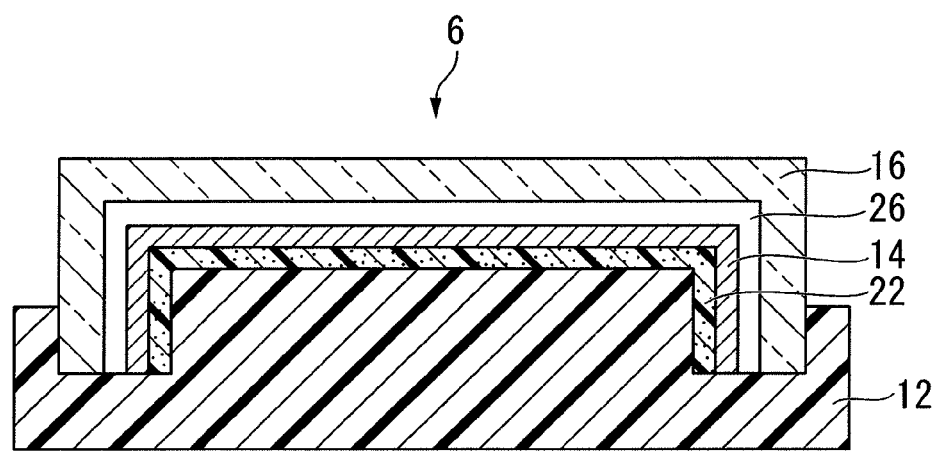
FIG. 7 is a cross sectional view showing another example of a radio wave transmitting decorative member according to the present invention.

FIG. 7 is a cross sectional view showing another example of a radio wave transmitting decorative member of the present invention.

A radio wave transmitting decorative member 6 includes a substrate 12 having a concave side and a convex side surrounded by the concave side; a transparent organic material layer 16 having a concave side, and the outer circumference of the transparent organic material layer 16 is same as the inner circumference of the concave side of the substrate 12. The radio wave transmitting decorative member 6 is integrated by facing the concave side of the transparent organic material layer 16 with the concave side of the substrate 12. An adhesion promoting layer 22 is placed on the surface of the convex side of the substrate 12, and a light reflecting layer 14 is placed on the surface of the adhesion promoting layer 22. In addition, a space 26 is formed between the light reflecting layer 14 and the transparent organic material layer 16.

The space 26 functions as a low refractive index layer.

Since the reference number in Embodiment 6 is the same as the one represented in Embodiment 1 and 3, explanations of the reference numbers which have already been described will be omitted.

The Seventh Embodiment

Figure 8:
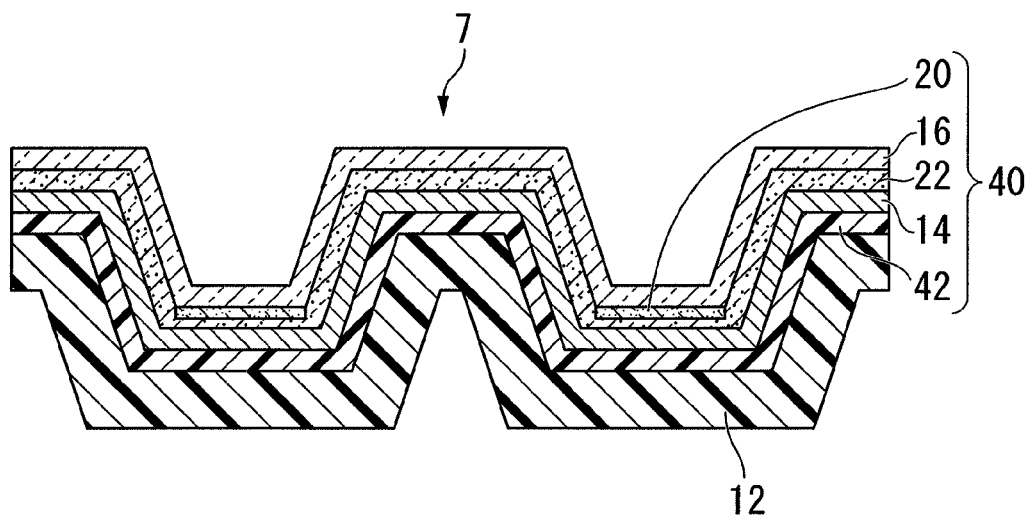
FIG. 8 is a cross sectional view showing another example of a radio wave transmitting decorative member according to the present invention.

FIG. 8 is a cross sectional view showing another example of a radio wave transmitting decorative member of the present invention.

A radio wave transmitting decorative member 7 is an insert shaped article which includes a substrate 12 having a convex-concave side, and a decorative film 40 which follows the convex-concave shapes of the substrate 12 are combined as one. The radio wave transmitting decorative member 7 is formed by placing the decorative film 40 in inside a metallic mold having a convex-concave side, followed by inputting a melting organic material into the metallic mold and solidifying the organic material.

Since the reference number in Embodiment 7 is the same as the one represented in Embodiment 1 and 3, explanations of the reference numbers which have already been described will be omitted.

A decorative film 40 includes a patterned transparent colored layer 20 placed on a surface of a transparent organic material layer 16; an adhesion promoting layer 22 which covers the transparent colored layer 20; and a light reflecting layer 14 placed on the surface of the adhesion promoting layer 22.

The radio wave transmitting decorative member 7 includes a light reflecting layer 14 which is inclined to an incident radio wave, therefore, the radio wave transmitting decorative member 7 is capable of transmitting a radio wave without reducing signals. On the other hand, in the conventional metal vapor deposition film, the islands become partially connected with each other and form a network that serves as a good conductor. Therefore, a radio wave transmitting property is inferior in the conventional metal deposition.

The Other Embodiment

Note that, the radio wave transmitting decorative member of the present invention is not limited in the figures represented in the present invention. The radio wave transmitting decorative member of the present invention at least includes a substrate, a transparent organic material layer, and a light reflecting layer formed of an alloy composed of either silicon or germanium and a metal provided between the substrate and the transparent organic material layer.

For example, shape of a substrate is not limited to a shaped article having a convex-concave shape represented in the figures. A substrate may be a film, a sheet, a plate or a shaped article of the other type.

In addition, a transparent organic material layer may be a shape which is able to combine a concave side of a substrate and/or a convex side of a substrate. In addition, a transparent organic material layer is not limited in a shaped article having a concave-convex shape represented in the figures, and a transparent organic material layer may be a coated film.

The radio wave transmitting decorative member of the present invention described above includes a light reflecting layer formed of an alloy composed of either silicon or germanium, and a metal which is provided between a substrate and a transparent organic material layer and thus the radio wave transmitting decorative member exhibits radio wave transmitting properties as well as metallic luster like chrome plating. In addition, because an alloy composed of either silicon or germanium and a metal is used which is less prone to oxidation, chlorination, or the like, because the alloy is chemically stable, has homogeneous membrane, and has small surface area compared to the known material such as tin or the like which has a larger surface area shape like an island by itself, and the loss of metallic luster is less likely to occur over time. In addition, the loss of metallic luster is less likely to occur since the light reflecting layer is protected by the transparent organic material layer. Moreover, because an alloy composed of either silicon or germanium and a metal is used which is cheaper than the simple substance of rare metals such as indium, the production cost is low.

The reason why an alloy containing a semiconductor material, such as silicon and germanium, allows radio waves to pass therethrough and exhibits metallic luster is thought to be as follows.

The presence of free electrons that characterizes metals brings electrical conductivity. Moreover, when an electromagnetic wave (such as light and radio waves) is about to enter within a metal, free electrons travel to cause a strong electronic polarization, thereby inducing electric fluxes that counteracts the electric field of the entering electromagnetic wave. Accordingly, it makes it difficult for the electromagnetic wave to enter within the metal, as a result of which the electromagnetic wave is reflected without being allowed to pass therethrough. Furthermore, because the alloy exhibits high reflectance in the visible light region, the reflected light is observed as metallic luster.

On the other hand, in the case of a semiconductor material, only a limited number of free electrons are present, and thus, unlike the case of a metal, radio waves are allowed to pass therethrough without being reflected. The metallic luster is thought to be caused, not by the presence of free electrons, but by the presence of strong absorption in the visible light region due to the direct transition between the bands, thereby inducing a strong electronic polarization, as a result of which the semiconductor material exhibits a high refractive index and thus a high reflectance.

In addition, the reason why an alloy composed of either silicon or germanium, and a metal, is used for a light reflecting layer is as follows.

Although silicon and germanium exhibits a high reflectance in the visible light region, it is lower than the reflectance of metals (for example, 98% reflectance for silver and 90% reflectance for aluminum at a wavelength of 620 nm, according to the value described in "Handbook of Optical Constants of Solids", edited by E. L. Palik (Academic Press, 1985)), which is 36% (at a wavelength of 620 nm, according to the value described in the Handbook). For this reason, by alloying silicon or germanium with a metal having a reflectance of 50% or higher, the reflectance can be improved and the lightness can be enhanced, thereby obtaining a light reflecting layer exhibiting bright metallic luster. In addition, because the metal is soft compared to silicon or the like, internal stress of the light reflecting layer is reduced, thereby improving the adhesiveness thereof and suppressing the occurrence of cracks.

EXAMPLES

Radio Wave Transmitting Properties

By using a coaxial-tube type, shielding effect measuring system (manufactured by Keycom Corporation under the trade name of S-39D, in accordance with ASTM D4935), a disc shaped sample was placed inside a coaxial tube having an outer body with an inner diameter of 39 mm, and the amounts of transmission attenuation (S21) and reflection attenuation (S11) were measured using a vector network analyzer (manufactured by Anritsu Corporation under the trade name of 37247C) connected to both ends of the coaxial tube. The more the amount of transmission attenuation approaches 0 dB, the more excellent the radio wave transmitting properties become.

(Incident Angle Dependence of Radio Wave Transmitting Properties)

Figure 9:
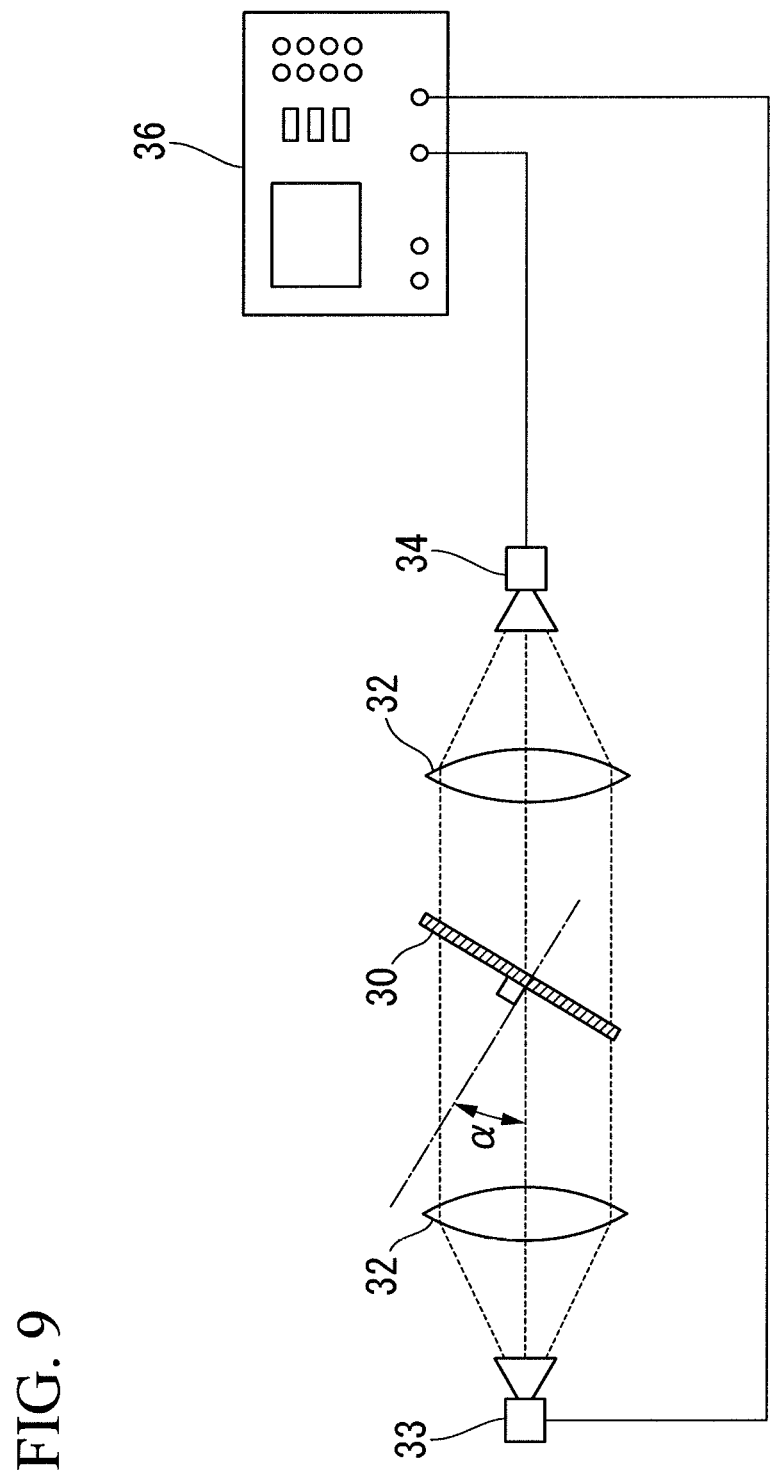
FIG. 9 is a schematic view showing a device measuring an incident angle dependence of millimeter waves.

Incident angle dependence of a radio wave transmitting properties were evaluated with use of a millimeter wave lens antennae of incident transmission absorption measuring apparatus (manufactured by Keycom Corporation) as shown in FIG. 9. A horn antenna composed of output antenna 33 and input antenna 34 (manufactured by Keycom Corporation, WR12) was placed in the apparatus. A planar wave of 76.5 GHz paralleled by a lense 32 was injected by adjusting the angle of the sample from −60 degrees to 60 degrees based on a flat sample 30. The planar wave was received by the input antenna 34, and the amount of transmission attenuation was measured by a scalar network analyzer 36 (Wiltron 54147A). The more the amount of transmission attenuation approaches 0 dB, the more excellent the radio wave transmitting properties become. In addition, the less difference in the amount of transmission attenuation in each incident angle is the less dependent in incident angle.

(Reflectance)

The term "reflectance" refers to the diffuse reflectance including the regular reflectance which is measured in accordance with JIS Z 8722 under a condition of d (n-D). The reflectance was measured including the regular reflection of luster component using an integrating sphere.

Specifically, the reflectance of a decorative member was measured including the regular reflection of luster component using an integrating sphere, by use of an ultraviolet visible near infrared spectrophotometer (manufactured by JASCO Corporation under the trade name of V-570). An average of the values collected from 401 points of measurement that were present across a region ranging from a wavelength of 380 nm to 780 nm was then determined.

(Transmittance)

The transmittance of a decorative member was measured, by the use of an integrating sphere, using an ultraviolet visible near infrared spectrophotometer (manufactured by JASCO Corporation under the trade name of V-570).

(Thickness of Light Reflecting Layer)

The thickness of a light reflecting layer was measured at five points by observing a cross section of the light reflecting layer using a transmission electron microscope (manufactured by JEOL Ltd., under the trade name of JEM-4000EX), and the measured values were averaged.

(Average Surface Roughness)

The average surface roughness (arithmetic average roughness Ra) was determined by scanning 1 $\mu m^2$ of the surface of a light reflecting layer using a scanning probe microscope (manufactured by SII NanoTechnology Inc. under the trade name of SPA300) with a dynamic force microscopy (DFM) mode, followed by the production of an image of the surface profile.

(Surface Resistivity)

A surface resistivity of the light reflecting layer was measured by placing a series 4-pin probe (ASP) on top of a light reflecting layer using a resistivity meter (Loresta GP, Model MCP-T600, manufactured by Dia Instruments Co., Ltd., in accordance with JIS K7194). The measurement voltage was set to 10 V.

Example 1

A transparent polycarbonate was formed and a shaped article which is a transparent organic material layer 16 having a concave side as shown in FIG. 1 was obtained (thickness: 0.3 mm).

An alloy powder composed of silicon which was doped with boron and aluminum (amount of aluminum: 70% by volume, amount of doped boron approx. 10 to 7 mol % (approx. 40 ppb), average particle diameter: 45 $\mu m$) which was obtained by a mechanical ironing method was prepared as a target by a uniaxial press under temperature of 610° C. and pressure of 400 Kgf/cm$^2$. A porosity of the target was 11%. The reflectance of a simple substance of aluminum was 87.6%.

The target was mounted on a DC sputtering apparatus (manufactured by Shibaura Mechatronics Corporation under the trade name of CFS-12P) as a cathode, and a light reflecting layer 14 was formed by physically depositing the target alloy physically to inner surface of a concave side of the shaped article by the DC sputtering.

Opaque ABS resin was formed and a substrate 12 having a convex side as shown in FIG. 1 was obtained.

A radio wave transmitting decorative member 1 as shown in FIG. 1 was obtained by combining a substrate 12 having a convex side and a shaped article having a concave side, wherein the shaped article includes a light reflecting layer 14 at inner surface of the shaped article (a transparent organic material layer 16).

With respect to the obtained radio wave transmitting decorative member 1, the thickness of the light reflecting layer, the average surface roughness, the amounts of transmission attenuation (S21) at 1 GHz and 3 GHz, and amount of reflection attenuation (S11), the reflectance and the surface resistivity in visible light that was incident from a transparent organic material layer 16 were measured. In addition, the outer appearance of the radio wave transmitting decorative member 1 was observed. Note that the amount of aluminum in the light reflecting layer was set to the same aluminum amount as in the target. The results are shown in Table 1.

Figure 10:
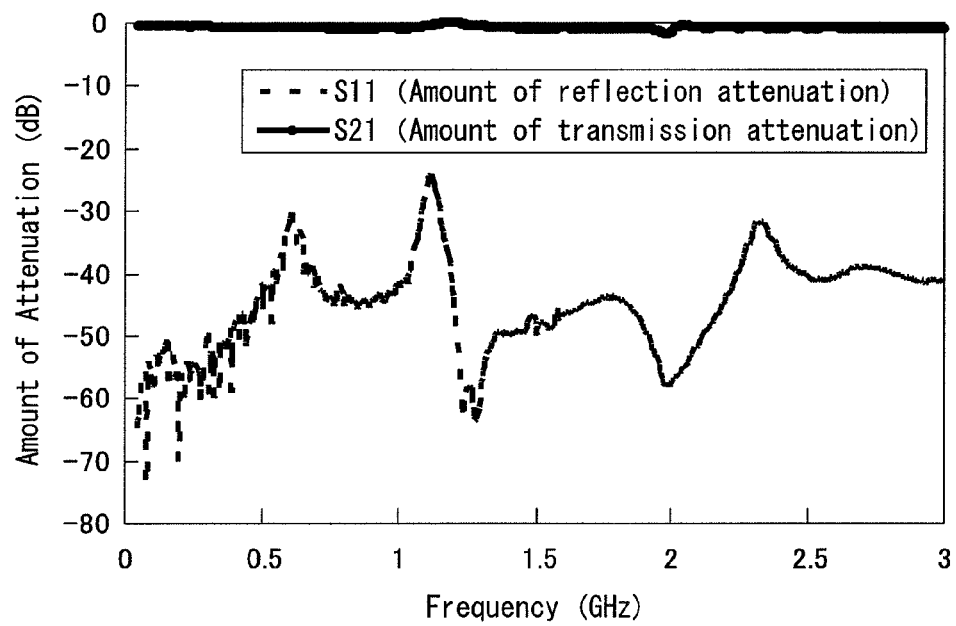
FIG. 10 shows a graph indicating the amount of transmission attenuation (S21) and amount of reflection attenuation (S11) of a radio wave transmitting decorative member obtained in Example 1.

In addition, a graph of the amounts of transmission attenuation (S21), and the amount of reflection attenuation (S11) of the radio wave transmitting decorative member 1 is shown in FIG. 10.

Figure 11:
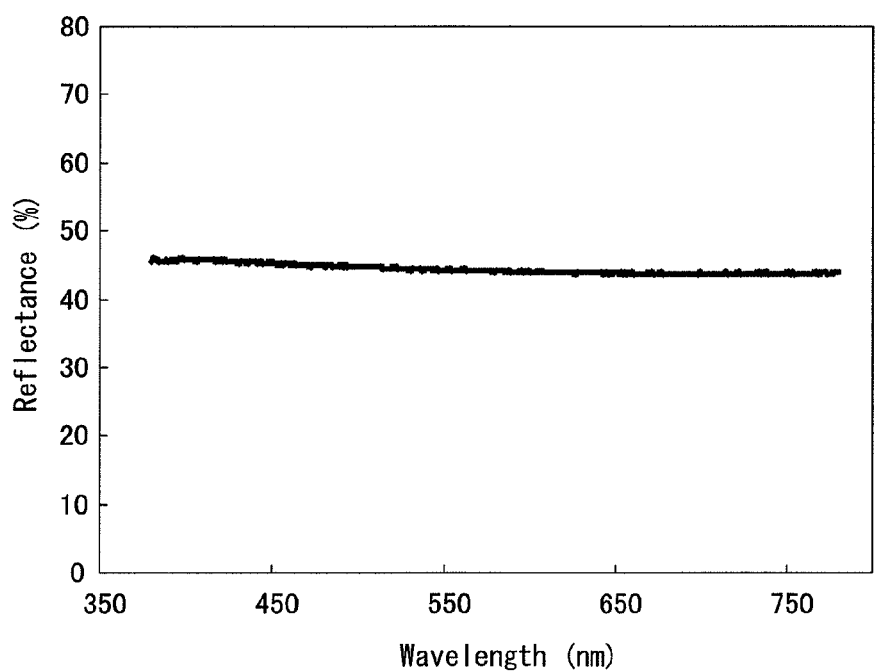
FIG. 11 shows a graph indicating the reflectance of radio wave transmitting decorative members in visible light obtained in Example 1.

Moreover, a graph of reflectance of the radio wave transmitting decorative member 1 is shown in FIG. 11.

Comparative Example 1

A decorative member was prepared in a similar way to that of Example 1, except that a simple substance of aluminum was used as a target.

With respect to the obtained decorative member, the thickness of the light reflecting layer, the average surface roughness, the amounts of transmission attenuation (S21) at 1 GHz and 3 GHz, the reflectance, and the surface resistivity were measured. In addition, the outer appearance of the decorative members was observed. The results are shown in Table 2.

Example 2

A transparent polycarbonate (refractive index: 1.59) was formed and a shaped article which is a transparent organic material layer 16 having a concave side as shown in FIG. 3 was obtained (thickness: 0.3 mm).

A UV hardened acrylic resin (refractive index after hardening: 1.49) was coated and hardened inner surface of the concave side of the shaped article, and a low refractive index layer 18 (thickness: 30 $\mu m$) was formed.

A target was prepared in a similar way to that of Example 1, except that amount of the aluminum was changed to 10% by volume. A light reflecting layer 14 was formed on the surface of the low refractive index layer 18 in a similar way to that of Example 1, except that the target was used.

Opaque ABS resin was formed and a substrate 12 having a convex side as shown in FIG. 3 was obtained.

A radio wave transmitting decorative member 2 as shown in FIG. 3 was obtained by combining a substrate 12 having a convex side and a shaped article having a concave side, wherein the shaped article includes a low refractive index layer 18 and a light reflecting layer 14 at inner surface of the shaped article (a transparent organic material layer 16).

With respect to the obtained radio wave transmitting decorative member 2, the thickness of the light reflecting layer, the average surface roughness, the amounts of transmission attenuation (S21) at 1 GHz and 3 GHz, the reflectance, and the surface resistivity were measured. In addition, the outer appearance of the radio wave transmitting decorative member 2 was observed. Note that the amount of aluminum in the light reflecting layer was set to the same aluminum amount as in the target. The results are shown in Table 1.

Example 3

Opaque ABS resin was formed and a substrate 12 having a concave side and a convex side surrounded by the concave side as shown in FIG. 7 was obtained.

A UV hardened acrylic resin (15% by volume of oxidized silicon having average particle diameter of 0.45 μm and 0.2% by volume of 3-mercaptopropyltrimethoxysilane) was coated and hardened, and an adhesion promoting layer 22 (thickness: 10 μm) was formed.

A light reflecting layer 14 was formed on the surface of the adhesion promoting layer 22 in a similar way to that of Example 2.

A transparent styrene resin (refractive index: 1.60) was formed, and a shaped article which is a transparent organic material layer 16 having a concave side as shown in FIG. 7 was obtained (thickness: 2 mm).

A radio wave transmitting decorative member 6 includes a substrate 12 having an adhesion promoting layer 22 and a light reflecting layer 14 formed on a convex side; and a shaped article (a transparent organic material layer 16), wherein the radio wave transmitting decorative member 6 was integrated by facing the concave side of the transparent organic material layer 16 with the concave side of the substrate 12 so as to form a space 26 between the light reflecting layer 14 and the transparent organic material layer 16, as shown in FIG. 7.

With respect to the obtained radio wave transmitting decorative member 6, the thickness of the light reflecting layer, the average surface roughness, the amounts of transmission attenuation (S21) at 1 GHz and 3 GHz, the reflectance, and the surface resistivity were measured. In addition, the outer appearance of the radio wave transmitting decorative member 6 was observed. Note that the amount of aluminum in the light reflecting layer was set to the same aluminum amount as in the target. The results are shown in Table 1.

Example 4

A transparent polycarbonate (refractive index: 1.59) was formed and a shaped article which is a transparent organic material layer 16 having a concave side as shown in FIG. 5 was obtained (thickness: 0.5 mm).

A colored pattern layer 24 was formed on the bottom of the shaped article by printing using black urethane paint.

A target was prepared in a similar way to that of Example 1, except that an alloy powder composed of a germanium (purity: 4 nine) and aluminum (amount of aluminum: 40% by volume, average particle diameter: 3.8 μm) as an alloy powder by atomization technique. A light reflecting layer 14 was formed on the surface of the colored pattern layer 24 and the side of the shaped article in a similar way to that of Example 1, except that the target was used.

Opaque ABS resin was formed and a substrate 12 having a convex side as shown in FIG. 5 was obtained.

A radio wave transmitting decorative member 4 as shown in FIG. 5 was obtained by combining a substrate 12 having a convex side, and a shaped article having a concave side, wherein the shaped article includes a colored pattern layer 24 and a light reflecting layer 14 at an inner surface of the shaped article (a transparent organic material layer 16).

With respect to the obtained radio wave transmitting decorative member 4, the thickness of the light reflecting layer, the average surface roughness, the amounts of transmission attenuation (S21) at 1 GHz and 3 GHz, the reflectance, and the surface resistivity were measured. In addition, the outer appearance of the radio wave transmitting decorative member 4 was observed. Note that the amount of aluminum in the light reflecting layer was set to the same aluminum amount as in the target. The results are shown in Table 1.

Example 5

A transparent polycarbonate was formed and a shaped article which is a transparent organic material layer 16 having a concave side as shown in FIG. 6 was obtained (thickness: 0.3 mm).

The surface of the concave side of the shaped article was treated with a corona discharge, followed by coating and hardening the surface with a UV hardened ethoxysilane modified acryl resin, and the adhesion promoting layer 22 (thickness: 10 μm) was formed.

The alloy powder composed of silicon (pure 4 nine), silver, and phosphorus for preventing a growth of primary phase of the silicon by atomization technique (amount of silver: 20% by volume, amount of phosphorus: 0.2% by volume (0.13%), average particle diameter: 3 μm) was prepared as a target by using a uniaxial press under temperature of 860° C. and pressure of 400 Kgf/cm². A porosity of the target was 7%. The reflectance of a simple substance of silver was 93.3%.

The light reflecting layer 14 was formed on the surface of the adhesion promoting layer 22 in a similar way in Example 1, except that the target was used.

The shaped article was heated at 110° C. for 2 hours, and segregated an aggregate of oxidized silicon in the adhesion promoting layer 22.

Opaque ABS resin was formed and a substrate 12 having a concave side as shown in FIG. 6 was obtained.

The radio wave transmitting decorative member 5 includes the substrate 12 and the shaped article (the transparent organic material layer 16) having the adhesion promoting layer 22 and the light reflecting layer 14 at inner surface of the shaped article, wherein the radio wave transmitting decorative member 5 was integrated by facing the concave side of the shaped article and the substrate so as to form the space 26 between the concave sides.

With respect to the obtained radio wave transmitting decorative member 5, the thickness of the light reflecting layer, the average surface roughness, the amounts of transmission attenuation (S21) at 1 GHz and 3 GHz, the reflectance, and the surface resistivity were measured. In addition, the outer appearance of the radio wave transmitting decorative member 5 was observed. Note that the amount of silver in the light reflecting layer was set to the same silver amount as in the target. The results are shown in Table 2.

Example 6

A transparent polycarbonate was formed and a shaped article which is a transparent organic material layer 16 having a concave side as shown in FIG. 6 was obtained (thickness: 0.3 mm).

The surface of the concave side of the shaped article was treated with a corona discharge, followed by coating the surface with an aqueous solution which oxidized titanium fine particles are dissolved in the solution (average particle diameter: approx. 10 nm; hydroxyl group or hydroperoxide groups are attached to the particle surface). Then, the surface was heated and dried, and an adhesion promoting layer 22 composed of oxidized titanium (thickness: 100 nm) was formed.

A light reflecting layer 14 was formed on the surface of the adhesion promoting layer 22 in a similar way as in Example 5.

Opaque ABS resin was formed and a substrate 12 having a concave side as shown in FIG. 6 was obtained.

A radio wave transmitting decorative member 5 includes a substrate 12 and a shaped article (a transparent organic material layer 16) having an adhesion promoting layer 22 and a light reflecting layer 14 at inner surface of the shaped article, wherein the radio wave transmitting decorative member 5 was integrated by facing the concave side of the shaped article and the substrate so as to form a space 26 between the concave sides.

With respect to the obtained radio wave transmitting decorative member 5, the thickness of the light reflecting layer, the average surface roughness, the amounts of transmission attenuation (S21) at 1 GHz and 3 GHz, the reflectance, and the surface resistivity were measured. In addition, the outer appearance of the radio wave transmitting decorative member 5 was observed. Note that the amount of silver in the light reflecting layer was set to the same silver amount as in the target. The results are shown in Table 2.

Example 7

A radar dome with an emblem design of a car as shown in FIG. 8 was formed in the following.

The surface of the biaxially oriented copolymer polyester film having a transparent property and a good forming article property (thickness: 50 μm) was treated with a plasma, followed by coating the substantial part of the surface of the polyester film with use of a urethane print, and the transparent colored layer 20 was formed.

Then, a UV hardened ethoxysilane modified acryl resin was coated on all surfaces of the polyester film, and the adhesion promoting layer 22 (thickness: 10 μm) was formed.

The alloy composed of silicon (pure 4 nine) and aluminum (amount of aluminum: 40% by volume) was prepared as a target. Then, the light reflecting layer 14 having a thickness of 75 nm was formed by a DC sputter device. In addition, the adhesion protecting layer 42 composed of ABS sheet (thickness: 0.1 mm) was laminated on top of the light reflecting layer 14 by a heat hardening urethane adhesive (not shown in the figure), and the decorative film 40 was obtained.

The thickness of the light reflecting layer, the average surface roughness, the reflectance, and the surface resistivity of the decorative film 40 were measured. In addition, the outer appearance of the decorative film 40 was observed. Note that the amount of aluminum in the light reflecting layer was set to the same aluminum amount as in the target. The results are shown in Table 2.

In addition, the heated decorative film 40 was inserted into a metallic mold (not shown in the Figure) having tapers with 30 degrees angles as shown in FIG. 8, and the substrate 12 was formed by inputting an ABS resin in the mold as well as forming the decorative film 40 as shown in FIG. 8. Then, the radio wave transmitting decorative member 7 was formed as shown in FIG. 8.

Figure 12:
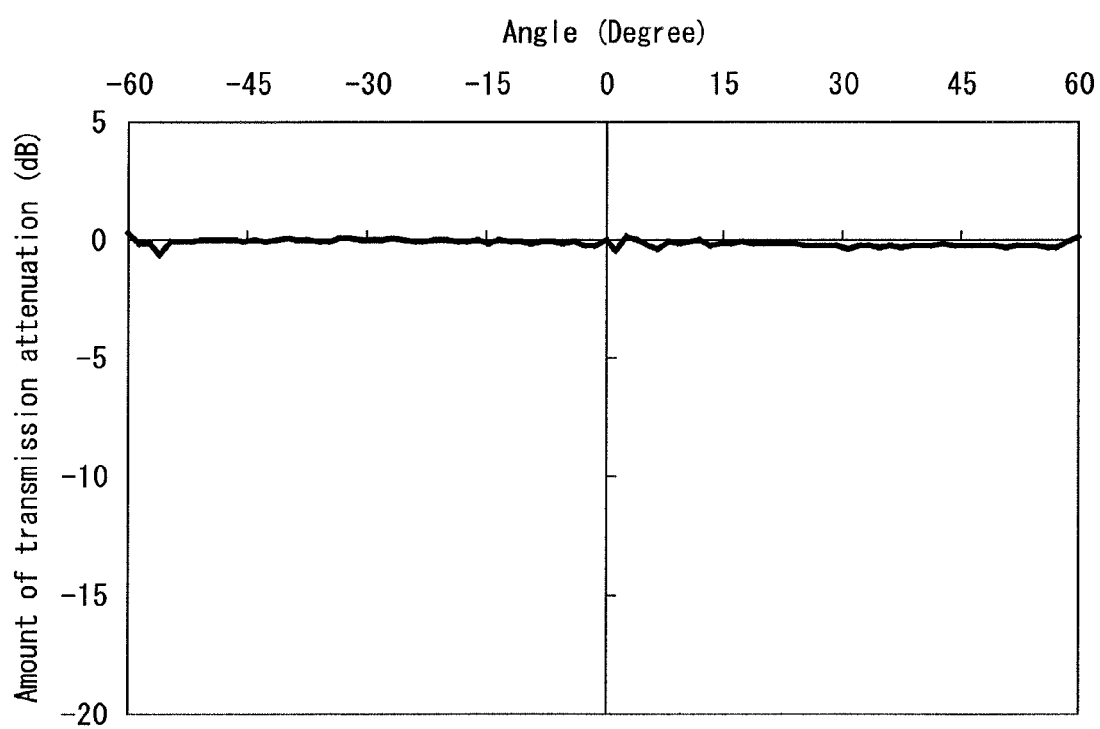
FIG. 12 shows a graph of the amount of transmission attenuation indicating the incident angle dependence of the radio wave in Example 7.

Incident angle dependence of radio wave transmission over the entire surface of the radio wave transmitting decorative member 7 was measured. The result is shown in FIG. 12.

TABLE 1

|  |  | Example 1 | Example 2 | Example 3 | Example 4 |
|---|---|---|---|---|---|
| Metal |  | Aluminum | Aluminum | Aluminum | Aluminum |
| Amount of metal (% by volume) |  | 70 | 10 | 10 | 40 |
| Thickness of light reflecting layer (nm) |  | 100 | 200 | 200 | 100 |
| Average surface roughness of light reflecting layer (nm) |  | 3.8 | 4.2 | 2.8 | 3.5 |
| Amount of transmission attenuation (dB) | 1 GHz | 0.0 | 0.0 | 0.0 | 0.1 |
|  | 3 GHz | 0.0 | 0.0 | 0.0 | 0.1 |
| Reflectance (%) | 400 nm | 45.6 | 43.1 | 48.1 | 45.5 |
|  | 500 nm | 44.7 | 42.6 | 47.9 | 44.3 |
|  | 600 nm | 44.0 | 42.0 | 46.6 | 43.9 |
|  | 700 nm | 43.6 | 41.5 | 47.0 | 44.2 |
|  | Average | 44.5 | 42.3 | 47.4 | 44.5 |
| Surface resistivity (Ω) |  | $4 \times 10^3$ | $10^8$以上 | $10^8$以上 | $2 \times 10^3$ |
| Appearance |  | metallic luster | metallic luster | metallic luster | metallic luster |

TABLE 2

|  |  | Example 5 | Example 6 | Example 7 | Comparative Example 1 |
|---|---|---|---|---|---|
| Metal |  | Silver | Silver | Aluminum | Aluminum |
| Amount of metal (% by volume) |  | 20 | 20 | 40 | 100 |
| Thickness of light reflecting layer (nm) |  | 75 | 75 | 70 | 200 |
| Average surface roughness of light reflecting layer (nm) |  | 2.9 | 2.8 | 3.2 | 3.8 |
| Amount of transmission attenuation (dB) | 1 GHz | 0.0 | 0.0 | — | −52.3 |
|  | 3 GHz | 0.0 | 0.0 | — | −51.9 |
| Incident angle dependence | −60 degrees | — | — | 0.28 | — |
|  | −30 degrees | — | — | 0.03 | — |

TABLE 2-continued

|  |  | Example 5 | Example 6 | Example 7 | Comparative Example 1 |
|---|---|---|---|---|---|
| Amount of transmission attenuation (dB) | 0 degrees | — | — | 0.0 | — |
|  | 30 degrees | — | — | −0.25 | — |
|  | 60 degrees | — | — | 0.18 | — |
| Reflectance (%) | 400 nm | 59.5 | 61.3 | 52.5 | 75.8 |
|  | 500 nm | 58.4 | 60.4 | 51.0 | 81.6 |
|  | 600 nm | 57.8 | 59.8 | 49.9 | 82.7 |
|  | 700 nm | 57.6 | 59.8 | 47.8 | 81.3 |
|  | Average | 58.3 | 60.3 | 50.3 | 80.4 |
| Surface resistivity (Ω) |  | $10^8$以上 | $10^8$以上 | $10^8$以上 | $4 \times 10^{-1}$ |
| Appearance |  | metallic luster | metallic luster | metallic luster | metallic luster |

INDUSTRIAL APPLICABILITY

The radio wave transmitting decorative member of the present invention is capable of being used in the casing or button of a mobile phone; the casing of a watch; the casing of a communication device and the front grille, and a bumper or the like of a vehicle.

BRIEF DESCRIPTION OF THE REFERENCE SYMBOLS

1. Radio wave transmitting decorative member
2. Radio wave transmitting decorative member
3. Radio wave transmitting decorative member
4. Radio wave transmitting decorative member
5. Radio wave transmitting decorative member
6. Radio wave transmitting decorative member
7. Radio wave transmitting decorative member
12. Substrate
14. Light reflecting layer
16. Transparent organic material layer
18. Low refractive index layer
20. Transparent colored layer (Colored layer)
22. Adhesion promoting layer
24. Colored pattern layer (Colored layer)
26. Space

The invention claimed is:

1. A radio wave transmitting decorative member comprising:
   a substrate;
   a transparent organic material layer; and
   a light reflecting layer provided between the substrate and the transparent organic material layer and formed of an alloy comprising both a metal and either silicon or germanium,
   wherein the metal has a reflectance of 50% or higher.

2. The radio wave transmitting decorative member according to claim 1, wherein the light reflecting layer is a deposition film formed by a physical vapor deposition of the alloy.

3. The radio wave transmitting decorative member according to claim 1, wherein the transparent organic material layer is a shaped article formed of a transparent organic material.

4. The radio wave transmitting decorative member according to claim 1, wherein the substrate is a shaped article formed of an organic material.

5. The radio wave transmitting decorative member according to claim 1, further comprising:
   a low refractive index layer provided between the transparent organic material layer and the light reflecting layer,
   wherein the low refractive index layer has lower refractivity than the refractivity of the transparent organic material layer.

6. The radio wave transmitting decorative member according to claim 5, wherein the low refractive index layer is a space formed of a gas or a vacuum.

7. The radio wave transmitting decorative member according to claim 1, further comprising:
   a colored layer provided between the transparent organic material layer and the light reflecting layer.

8. The radio wave transmitting decorative member according to claim 7, wherein the colored layer is a patterned layer.

9. The radio wave transmitting decorative member according to claim 1, further comprising:
   an adhesion promoting layer;
   wherein the adhesion promoting layer contacts with the light reflecting layer.

10. The radio wave transmitting decorative member according to claim 9, wherein the adhesion promoting layer includes a metal oxide.

11. The radio wave transmitting decorative member according to claim 10, wherein the adhesion promoting layer is formed by dealcoholizing condensation of a resin having a metal alkoxyl group.

12. A method of producing a radio wave transmitting decorative member having a substrate, a transparent organic material layer, and a light reflecting layer formed of an alloy comprising both a metal and either silicon or germanium, the light reflecting layer provided between the substrate and the transparent organic material layer, the method comprising:
   forming the light reflecting layer from a target having the alloy,
   wherein the light reflective layer has a reflectance of 50% or higher formed with use of a DC magnetrons spattering.

13. The method of producing the radio wave transmitting decorative member according to claim 12, wherein the target further contains a dopant.

14. The method of producing the radio wave transmitting decorative member according to claim 12, wherein the target is a shaped article of an alloy powder having an average particle diameter of less than 100 μm.

* * * * *